(12) United States Patent
Chen

(10) Patent No.: US 11,316,495 B2
(45) Date of Patent: Apr. 26, 2022

(54) SURFACE ACOUSTIC WAVE DEVICE

(71) Applicant: Zhuohui Chen, Ottawa (CA)

(72) Inventor: Zhuohui Chen, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 824 days.

(21) Appl. No.: 15/813,888

(22) Filed: Nov. 15, 2017

(65) Prior Publication Data
US 2019/0149122 A1 May 16, 2019

(51) Int. Cl.
H03H 9/02 (2006.01)
H03H 9/64 (2006.01)
H03H 9/145 (2006.01)

(52) U.S. Cl.
CPC .... H03H 9/02574 (2013.01); H03H 9/14502 (2013.01); H03H 9/14538 (2013.01); H03H 9/6469 (2013.01)

(58) Field of Classification Search
CPC .......... H03H 9/02574; H03H 9/14502; H03H 9/6469
See application file for complete search history.

(56) References Cited

U.S. PATENT DOCUMENTS

| 5,294,859 A | 3/1994 | Yamanouchi et al. |
| 5,576,589 A | 11/1996 | Dreifus et al. |
| 7,615,910 B1 | 11/2009 | Shih et al. |
| 2007/0228873 A1 | 10/2007 | Lin et al. |
| 2009/0256444 A1* | 10/2009 | Suzuki ...................... H03H 3/10 |
| | | 310/313 B |
| 2011/0068655 A1* | 3/2011 | Solal ................... H03H 9/02858 |
| | | 310/313 B |
| 2016/0182008 A1* | 6/2016 | Bhattacharjee ....... H01L 41/312 |
| | | 310/313 B |
| 2017/0085246 A1* | 3/2017 | Shih ..................... H03H 9/02574 |
| 2018/0159495 A1* | 6/2018 | Inoue ................. H03H 9/02574 |
| 2018/0219525 A1* | 8/2018 | Chen ................. H03H 9/14544 |

FOREIGN PATENT DOCUMENTS

| CN | 1264505 A | 8/2000 |
| CN | 1645744 A | 7/2005 |
| CN | 101540591 A | 9/2009 |
| EP | 1467484 A2 | 10/2004 |

(Continued)

OTHER PUBLICATIONS

Dow et al., "15 GHz SAW Nano-Transducers Using Ultrananocrystal-line Diamond/A1N Thin Films", 2012 IEEE International Ultrasonics Symposium Proceedings, pp. 968-971.

(Continued)

Primary Examiner — Bryan P Gordon

(57) ABSTRACT

Surface acoustic wave (SAW) devices and methods of fabricating SAW devices are disclosed. The disclosed SAW device includes a piezoelectric layer. The SAW device also includes at least one transducer coupled to the piezoelectric layer. The transducer includes a first set of electrodes and a second set of electrodes. Each electrode in the first set of electrodes is directly adjacent to at least one electrodes in the second set of electrodes along a wave propagation axis, and the first and second set of electrodes are separated from each other along a depth axis.

15 Claims, 15 Drawing Sheets

(56) References Cited

FOREIGN PATENT DOCUMENTS

EP        1 643 641 A2     4/2006
GB        2106346 A       4/1983

OTHER PUBLICATIONS

J. G. Rodriguez-Madrid et al., "Super-High-Frequency SAW Resonators on AlN/Diamond", IEEE Electron Device Letters, vol. 33, No. 4, pp. 495-497, Apr. 2012.

R. Ro et al., "Theoretical Analysis of SAW Propagation Characteristics in (100) Oriented AlN/Diamond Structure", IEEE Transactions on Ultrasonics, Ferroelectrics, and Frequency Control, vol. 57, No. 1, pp. 46-51, Jan. 2010.

Lin et al., "Surface Acoustic Wave Properties of (100) AlN Films on Diamond with Different IDT Positions", IEEE Transactions on Ultrasonics, Ferroelectrics, and Frequency Control, vol. 56, No. 6, pp. 1246-1251, Jun. 2009.

* cited by examiner

SURFACE ACOUSTIC WAVE DEVICE

FIELD

The disclosure relates to surface acoustic wave (SAW) devices. In various examples, the disclosure relates to SAW devices suitable for operating in high frequency ranges, such as the K band frequency range.

BACKGROUND

In communication systems (both terminal and base station infrastructure), surface acoustic wave (SAW) filters and resonators are widely used. For the next generation wireless communication of 5G new radio (NR), there is growing demand for higher operating frequency, lower insertion loss, higher transmitting power, and/or wider channel bandwidth.

The maximum operating frequency of a SAW device has conventionally been limited by the acoustic velocity of the substrate material used and the dimension of the smallest line feature that can be achieved in the device fabrication process. For a typical lithography process used in fabrication of a SAW device, due to tradeoffs between the feature size of the lithography process and material characteristics, the smallest line that is achievable in practice is about 0.2 µm in width. An example construction for a SAW device may use a layered interdigital transducer (IDT) electrode/aluminum nitride (AlN)/diamond structure. Using conventional configurations and fabrication techniques, a typical SAW device may have a maximum operating frequency of about 14 GHz.

It would be desirable to provide a SAW device that can operate in higher frequency ranges, such as the K band frequency range, which is from about 18 GHz to about 27 GHz, without having to reduce the feature size of the lithography process beyond what is conventionally achieved in practice.

SUMMARY

In various examples described herein, a SAW device is described in which first and second sets of electrodes are configured to be separated in depth and laterally adjacent to each other. Such a configuration has been found to enable fabrication of a SAW device that has an operating frequency above 14 GHz, for example about 25 GHz or higher.

In some aspects, the present disclosure describes a SAW device including a piezoelectric layer and at least one transducer coupled to the piezoelectric layer. The at least one transducer includes a first set of electrodes and a second set of electrodes. Each electrode in the first set of electrodes is directly adjacent to at least one electrodes in the second set of electrodes along a wave propagation axis, and the first and second set of electrodes are separated from each other along a depth axis.

In any of the preceding aspects/embodiments, the SAW device may also include a high acoustic velocity layer coupled to the piezoelectric layer at a first surface of the piezoelectric layer. The at least one transducer may be positioned between the piezoelectric layer and the high acoustic velocity layer. One of the first set or the second set of electrodes may be embedded in the piezoelectric layer, and another of the first set or the second set of electrodes may be embedded in the high acoustic velocity layer.

In any of the preceding aspects/embodiments, the SAW device may also include a conductive layer coupled to a second surface of the piezoelectric layer, opposing the first surface of the piezoelectric layer.

In any of the preceding aspects/embodiments, the conductive layer may include multi-layer graphene.

In any of the preceding aspects/embodiments, the SAW device may also include a high acoustic velocity layer coupled to the piezoelectric layer at a first surface of the piezoelectric layer. The at least one transducer may be coupled to the piezoelectric layer at a second surface of the piezoelectric layer, opposing the first surface of the piezoelectric layer. One of the first set or the second set of electrodes may be embedded in the piezoelectric layer, and another of the first set or the second set of electrodes may be on the second surface of the piezoelectric layer.

In any of the preceding aspects/embodiments, the SAW device may also include a conductive layer coupled between the piezoelectric layer and the high acoustic velocity layer. The piezoelectric layer and the high acoustic velocity layer may be coupled to each other via the conductive layer.

In any of the preceding aspects/embodiments, the conductive layer may include multi-layer graphene.

In any of the preceding aspects/embodiments, the first set of electrodes may be embedded in the piezoelectric layer and the second set of electrodes may be on a surface of the piezoelectric layer. The SAW device may also include an insulating layer covering at least the first set of electrodes.

In any of the preceding aspects/embodiments, the SAW device may have an operating wavelength $\lambda$. The first set and second set of electrodes may be separated from each other along the depth axis by a depth separation, and the depth separation may be in the range of about $0.01\lambda$ to about $0.10\lambda$.

In any of the preceding aspects/embodiments, the depth separation may be about $0.07\lambda$.

In any of the preceding aspects/embodiments, the first set and second set of electrodes may include multi-layer graphene.

In any of the preceding aspects/embodiments, the first set and second set of electrodes may include multi-layer graphene coupled to metal.

In any of the preceding aspects/embodiments, each electrode in the first set and second set of electrodes may have a width of about 0.2 µm.

In any of the preceding aspects/embodiments, the SAW device may have an operating frequency in the K band frequency range.

In any of the preceding aspects/embodiments, the SAW device may have an operating frequency of about 25 GHz.

In some aspects, the present disclosure describes a method of fabricating a SAW device. The method includes forming a first set of electrodes on a substrate at a first depth. The method also includes forming a second set of electrodes on the substrate at a second depth. Each electrode in the first set of electrodes is directly adjacent to at least one electrodes in the second set of electrodes along a wave propagation axis. The first and second set of electrodes are separated from each other along a depth axis.

In any of the preceding aspects/embodiments, forming the first set electrodes may include etching the substrate and forming the first set of electrodes in etched portions of the substrate. Forming the second set of electrodes may include forming the second set of electrodes in unetched portions of the substrate.

In any of the preceding aspects/embodiments, the substrate may be a high acoustic velocity layer, and the method may also include forming a piezoelectric layer over the first and second sets of electrodes.

In any of the preceding aspects/embodiments, the method may also include forming a conductive layer over the piezoelectric layer.

In any of the preceding aspects/embodiments, the substrate may be a piezoelectric layer.

In any of the preceding aspects/embodiments, the method may also include forming an insulating layer over the first set of electrodes.

In any of the preceding aspects/embodiments, the conductive layer may include multi-layer graphene.

In any of the preceding aspects/embodiments, the SAW device may have an operating wavelength λ. The first set and second set of electrodes may be separated along the depth axis by a depth separation, and the depth separation may be in the range of about 0.01λ to about 0.10λ.

In any of the preceding aspects/embodiments, the first set and second set of electrodes may include multi-layer graphene.

In any of the preceding aspects/embodiments, each electrode in the first set and second set of electrodes may have a width of about 0.2 μm.

In some aspects, the present disclosure describes a method of fabricating a SAW device. The method includes providing a piezoelectric layer; and forming a first set of electrodes and a second set of electrodes coupled to the piezoelectric layer. Each electrode in the first set of electrodes is directly adjacent to at least one electrodes in the second set of electrodes along a wave propagation axis. The first and second set of electrodes are separated from each other along a depth axis.

In any of the preceding aspects/embodiments, the method may also include forming an insulating layer over the first set of electrodes.

In any of the preceding aspects/embodiments, the method may also include providing a high acoustic velocity layer. The piezoelectric layer may be provided by forming the piezoelectric layer over the high acoustic velocity layer.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Developments in surface acoustic wave (SAW) devices, such as SAW filters, have provided SAW devices with operating frequency up to about 14 GHz, using layered aluminum nitride (AlN)/diamond multilayer structures. Diamond has been frequently selected as the material for the high acoustic velocity layer because diamond exhibits good acoustic velocity properties. However, the ability to operate at frequencies higher than 14 GHz, such as in the K band frequency range, is currently limited by the material properties of the AlN layer and diamond layer, electrode width and the spacing between the electrodes used to generate the SAW. In a typical fabrication process, lithography techniques are used to form electrodes on a SAW device. In a conventional fabrication process, there is a tradeoff between the size of the process node (also referred to as technology node or fabrication node) and the thickness of the piezoelectric layer. With a smaller process node, smaller lithography features can be formed; however, the thickness of the piezoelectric layer decreases as the size of the process node decreases, and a piezoelectric layer that is too thin will lose piezoelectric properties. In view of this tradeoff, conventionally, a SAW device is usually fabricated with line widths no narrower than about 0.2 μm. This means that conventionally the electrode width and the gap between electrodes are limited to a minimum of about 0.2 μm.

In various examples, the present disclosure describes SAW devices in which first and second sets of electrodes are configured to be laterally adjacent to each other (i.e., having negligible lateral spacing between the first and second electrodes), but separated in depth. Such a configuration has been found to enable fabrication of a SAW device that has an operating frequency at about 25 GHz or higher, and still have a piezoelectric layer that is sufficiently thick to keep its desirable properties, as discussed above.

Figure 1:
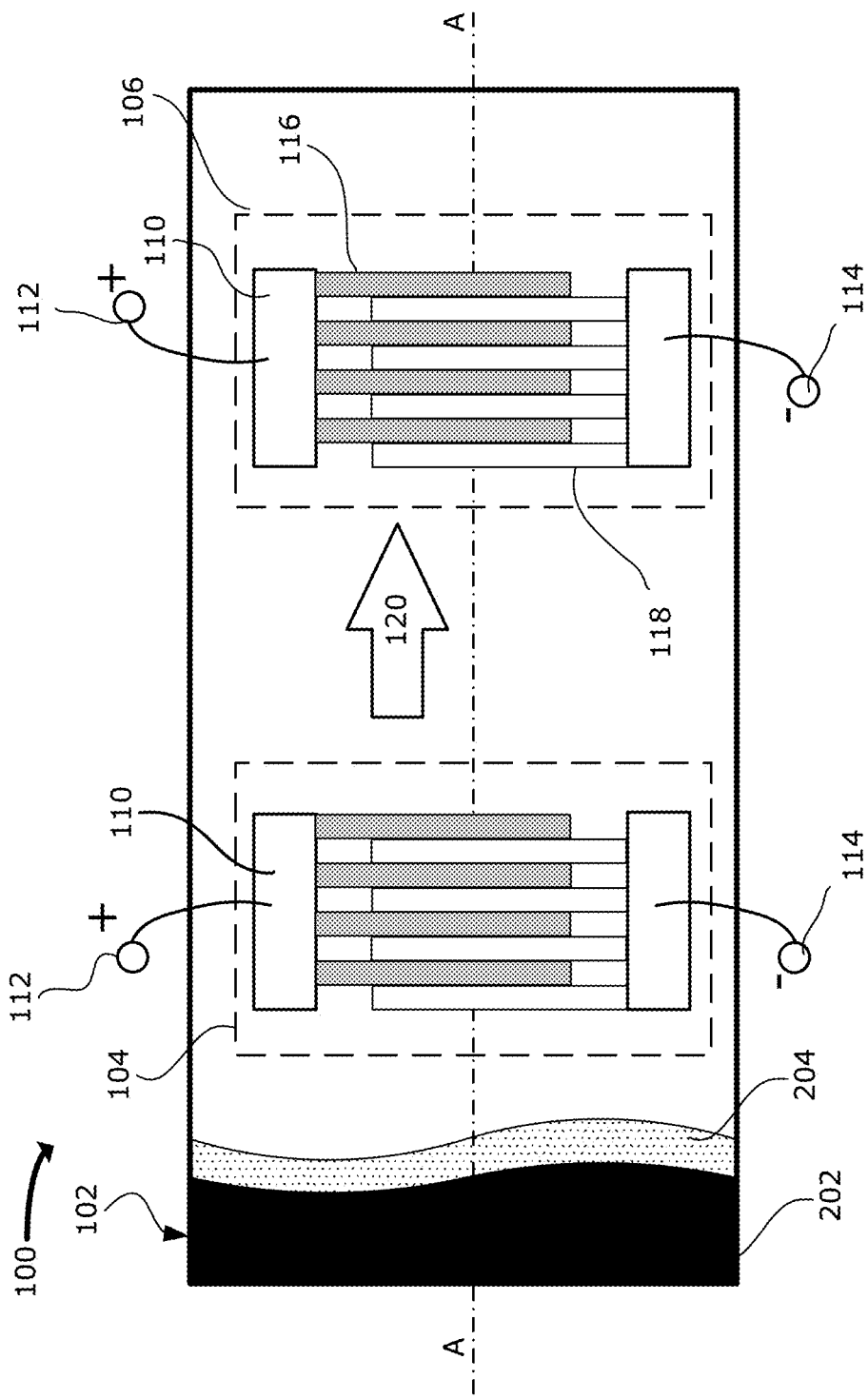
FIG. 1 is a top plan cut away view of an example disclosed SAW device having laterally adjacent first and second electrodes.

An example SAW device 100, for example a transversal filter, is shown in FIG. 1. The dimensions of certain features have been exaggerated for illustration purposes. Although the description below makes reference to a particular SAW device 100, the techniques described herein may equally apply to other types of SAW filters and/or resonators. For example, any SAW transducer, interdigital transducer (IDT), inter-digitated interdigital transducer (IIDT), ladder-type filter, or other such devices may incorporate any of the configurations described herein.

The SAW device 100, which in this example embodiment is depicted as a basic filter for clarity and illustrative purposes, includes a multi-layered body 102 (as discussed further below). An input transducer 104 and an output transducer 106 are coupled to the body 102, each indicated by their respective dashed box. In this example, an upper conductive layer 202 and a piezoelectric layer 204 of the body 102 have been partially cut away to show the transducers 104, 106. Each of the transducers 104, 106 includes a first terminal 112 (e.g., a positive terminal) and a second terminal 114 (e.g., a grounded terminal). In the case of the input transducer 104, the terminals 112, 114 are input terminals (e.g., positive and grounded input terminals). Similarly, for the output transducer 106, the terminals 112, 114 are output terminals (e.g., positive and grounded output terminals). Each of the terminals 112, 114 is coupled to respective first electrodes 116 (e.g., positive electrodes) and second electrodes 118 (e.g., negative electrodes) via respective bonding pads 110. Only four first electrodes 116 and four second electrodes 118 for each transducer 104, 106 are shown, however there may be greater or fewer numbers of electrodes 116, 118 in each transducer 104, 106. It should be understood that the terminals 112, 114 may be any two of positive, negative or grounded terminals, and the electrodes 116, 118 may correspondingly be any two of positive, negative or grounded electrodes. Generally, the electrodes 116 and 118 are two distinct sets of electrodes for conducting different voltages.

Each of the transducers 104, 106 is an IDT. The first electrodes 116 and second electrodes 118 are interlaced in an alternating pattern, as shown in FIG. 1. Thus, each first electrode 116 is laterally adjacent to at least one second electrode 118. Each individual one of the electrodes 116, 118 is generally parallel to each other electrode 116, 118, and arranged perpendicularly to the direction of wave propagation (indicated by the arrow 120).

When power is supplied to the terminals 112, 114 of the input transducer 104, the input transducer 104 converts the electrical signal energy into a SAW propagating along the body 102. The SAW is carried across the body 102 and the SAW is converted back into an electrical signal by the output transducer 106. The electrical signal is then provided at the terminals 112, 114 of the output transducer 106, for example to be received by a processor (not shown) via an analog-to-digital converter (not shown).

Figure 2:
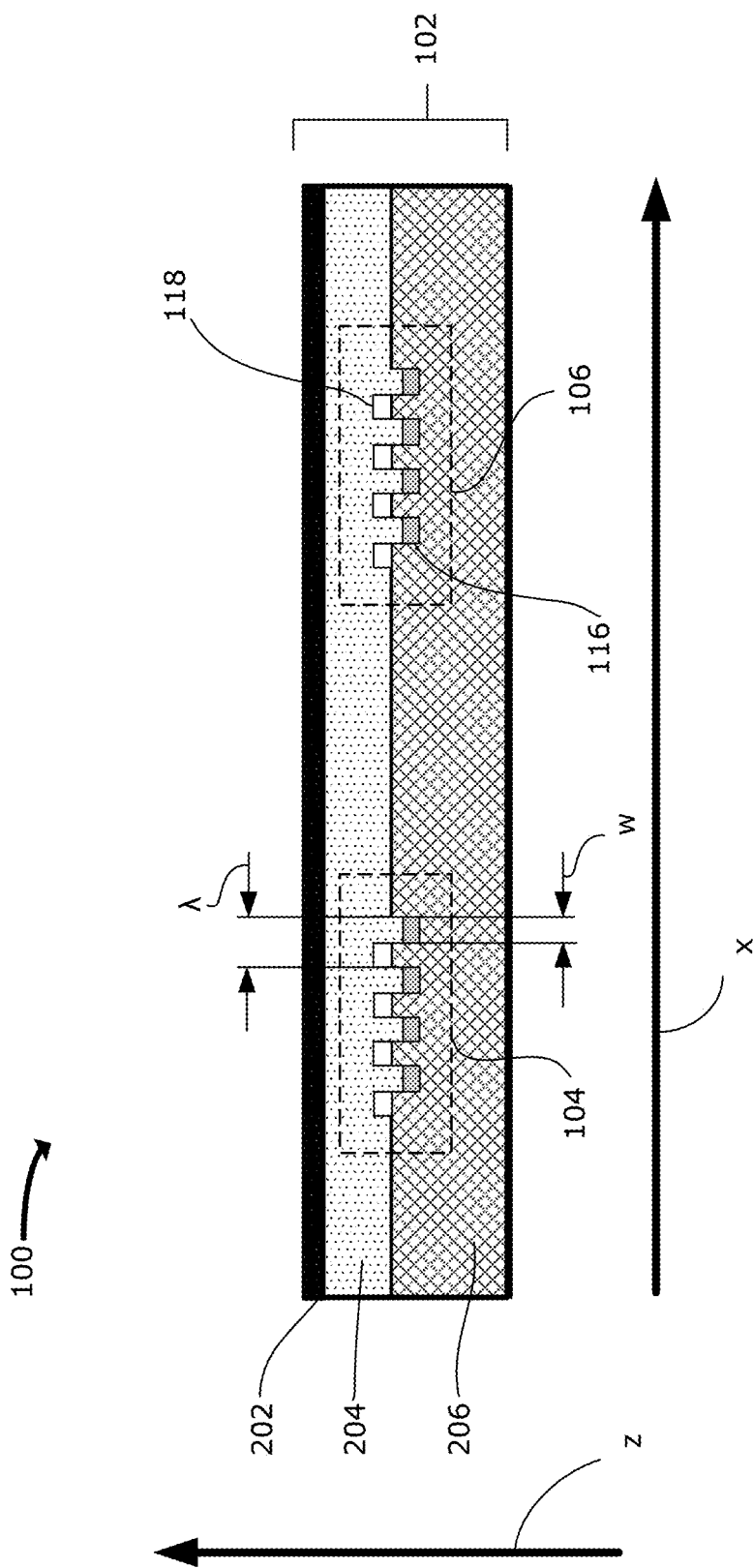
FIG. 2 is a side cross-sectional view of the example disclosed SAW device of FIG. 1.

FIG. 2 illustrates a side cross-sectional view, along line A-A in FIG. 1, of the example disclosed SAW device 100. The dimensions of certain features have been exaggerated for illustration purposes. The operating wavelength λ (corresponding to the operating frequency $f_0$) of the SAW device 100 is determined by spacing of the first and second electrodes 116, 118. Specifically, the operating wavelength λ is defined by the distance from one of the first electrodes 116 to the next one of the first electrodes 116 (or similarly the distance from one of the second electrodes 118 to the next one of the second electrodes 118). A wave propagation axis x is defined as the axis along which a SAW propagates along the piezoelectric layer 204 in the SAW device 100. The wave propagation axis x may also be referred to as the lateral axis. A depth axis z is defined as the axis that is perpendicular to the lateral surface of the body 102. The depth axis z may also be referred to as the vertical axis.

In the example shown, the first and second electrodes 116, 118 alternate with each other in an interlaced (or interdigital) arrangement, and are oriented such that the longitudinal axis of each electrode 116, 118 is perpendicular to the propagation axis x. The first and second electrodes 116, 118 are directly adjacent to each other along the propagation axis x, and spaced apart along the depth axis z. Thus, from a top-down view, as shown in FIG. 1, each first electrode 116 is laterally adjacent to at least one second electrode 118. From a cross-sectional view, as shown in FIG. 2, it can be seen that each first electrode 116 is spaced apart from the second electrodes 118 by a vertical distance. The separation of the first and second electrodes 116, 118 along the depth axis z is sufficient to avoid shorting of the first and second electrodes 116, 118. In various simulations, it has been found that a separation in the range of about 0.01-0.1λ, for example about 0.01λ-0.03λ depending on operating frequency, is sufficient to avoid shorting of the first and second electrodes 116, 118. The separation of the first and second electrodes 116, 118 is measured as the distance, along the depth axis, from the bottom of the upper electrode (second electrode 118 in this example) to the top of the lower electrode (first electrode 116 in this example).

In the example of FIG. 2, the body 102 of the SAW device 100 includes a piezoelectric layer 204 (e.g., AlN film) and a high acoustic velocity layer 206 (e.g., a diamond layer) coupled to a first surface of the piezoelectric layer 204. Optionally, a conductive layer 202 (which may also be referred to as a short layer or a short surface) may be coupled to a second surface of the piezoelectric layer 204, opposite to the first surface, as shown in FIG. 2. In this example, the transducers 104, 106 are positioned between the piezoelectric layer 204 and the high acoustic velocity layer 206, with the first electrodes 116 being embedded in the high acoustic velocity layer 206 (that is, positioned on a plane below the surface of the high acoustic velocity layer 206) and the second electrodes 118 being embedded in the piezoelectric layer 204 (that is, positioned on a plane above the surface of the high acoustic velocity layer 206). Thus, another way to describe the configuration of the electrodes 116, 118 is that each first electrode 116 is directly adjacent to at least one second electrode 118, and that the first electrodes 116 are positioned in a first plane that is parallel to and spaced apart from a second plane on which the second electrodes 118 are positioned. The position of the first and second electrodes 116, 118 may be interchanged.

Figure 3:
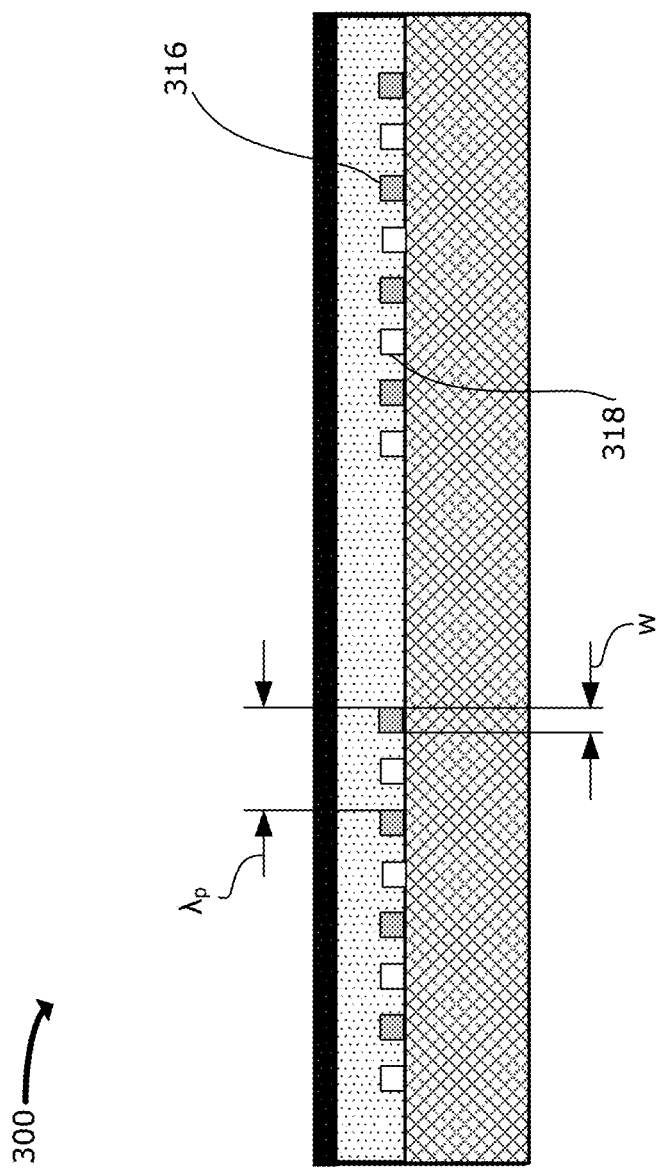
FIG. 3 is a side cross-sectional view of a conventional SAW device.

The arrangement of the electrodes 116, 118 in the example disclosed SAW device 100 may be appreciated by comparing to an example conventional SAW device 300 shown in FIG. 3. For the purpose of comparison, the conventional SAW device 300 has a similar body configuration as the example disclosed SAW device 100. However, in the conventional SAW device 300, the first electrodes 316 (e.g., positive electrodes) and second electrodes 318 (e.g., negative electrodes) are positioned in substantially the same plane, and spaced apart from each other laterally. Because of properties that depend on the thickness of the piezoelectric layer, the smallest feature size (or feature width) w is typically about 0.2 μm.

In the conventional SAW device 300, the smallest distance between a first electrode 316 and an adjacent second electrode 318 is of the feature size w. The smallest width of the first electrode 316 and of the second electrode 318 is also the feature size w. In the conventional SAW device 300, the operating wavelength $\lambda_p$ is defined by the distance from one of the first electrodes 316 to the next one of the first electrodes 316, which is equal to 4 w (0.8 μm, where w=0.2 μm). In comparison, the example disclosed SAW device 100, as illustrated in FIG. 2, can achieve an operating wavelength λ, again defined by the distance from one of the first electrodes 116 to the next one of the first electrodes 116, equal to 2 w (0.4 μm, where w=0.2 μm). Thus, the example disclosed SAW device 100 is able to achieve an operating wavelength λ that is half of the operating wavelength $\lambda_p$ of the conventional SAW device 300, under the same fabrication conditions. The example disclosed SAW device 100 may therefore significantly increase the operating frequency, for example up to 25 GHz or more, compared to the conventional SAW device 300.

Figure 4A:
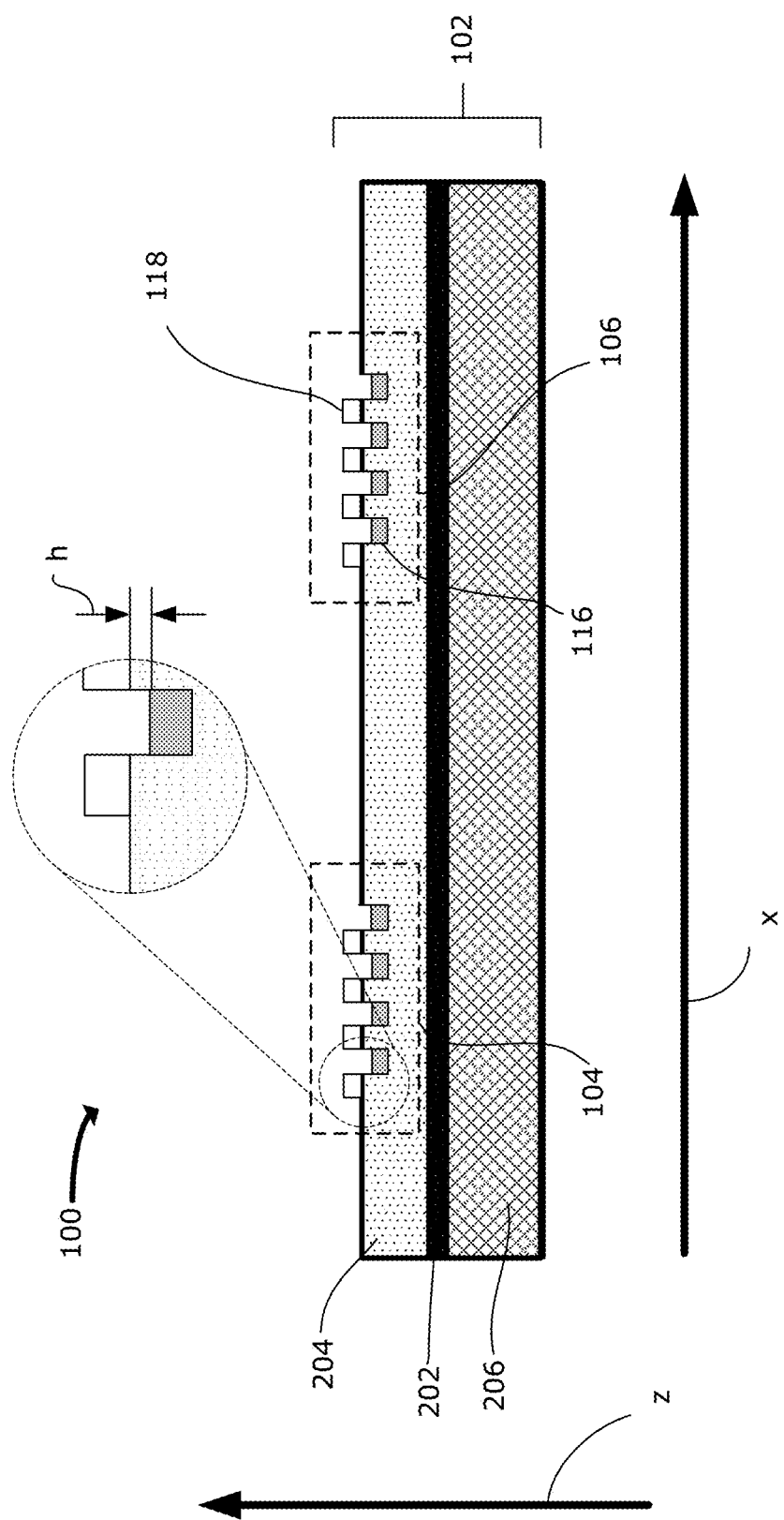
FIG. 4A is a side cross-sectional view of another example disclosed SAW device.

FIG. 4A illustrates a side cross-sectional view of another example configuration of the SAW device 100. The dimensions of certain features have been exaggerated for illustration purposes. The body 102 of the SAW device 100 includes the high acoustic velocity layer 206 (e.g., a diamond layer) coupled to the first surface of the piezoelectric layer 204 (e.g., AlN film). Unlike the example configuration of FIG. 2, in the configuration illustrated in the example of FIG. 4A, the transducers 104, 106 are coupled to the second surface of the piezoelectric layer 204, opposite to the first surface. Optionally, as shown in FIG. 4A, the body 102 may also include the conductive layer 202 coupled between the high acoustic velocity layer 206 and the piezoelectric layer 204, in which case the high acoustic velocity layer 206 is coupled to the piezoelectric layer 204 via the conductive layer 202. In the example shown, the first electrodes 116 are embedded in the piezoelectric layer 204 (that is, positioned on a plane below the second surface of the piezoelectric layer 204) and the second electrodes 118 are positioned on the second surface of the piezoelectric layer 204.

In some examples, an insulating layer (not shown), such as a layer of dielectric material (e.g., silicon dioxide ($SiO_2$)), may be coupled to the piezoelectric layer 204, over at least the first electrodes 116, to ensure there is no shorting between the first and second electrodes 116, 118. In some examples, the insulating layer may cover both sets of electrodes 116, 118. In other examples, the separation (e.g., in the range of about 0.01-0.10λ) between the first and second electrodes 116, 118 along the depth axis z may be sufficient to avoid shorting the electrodes 116, 118, without requiring an additional insulating layer over the electrodes 118. In some cases, the first and second electrodes 116, 118 may be misaligned during fabrication (e.g., due to misalignment of the masks used to form each set of electrodes 116, 118), such that the first and second electrodes 116, 118 partially overlap in the depth direction, resulting in shorting. The inclusion of an insulating layer over at least the first electrodes 116 may help to avoid such shorting due to misalignment. Even when misalignment of the electrodes 116, 118 is not an issue (e.g., both sets of electrodes 116, 118 are fabricated using a single mask), the inclusion of the insulating layer may provide other benefits, such as increased device reliability, better power handling and/or reduced frequency drift caused by temperature fluctuations. However, omission of the insulating layer may provide other benefits, such as a simpler fabrication process.

Figure 4B:
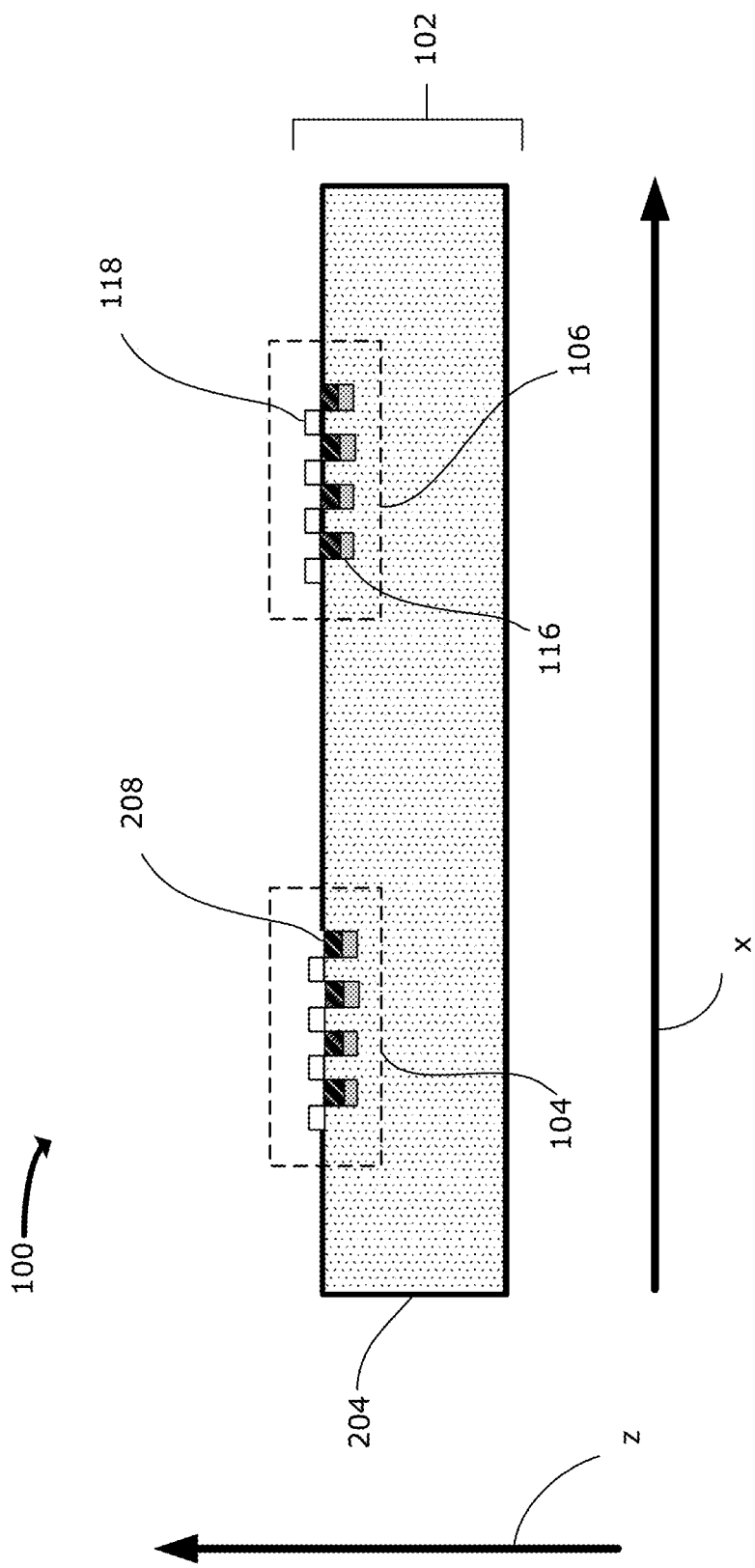
FIG. 4B is a side cross-sectional view of another example disclosed SAW device.

FIG. 4B illustrates a side cross-sectional view of another example configuration of the SAW device 100. In this example, the SAW device 100 is implemented on a single crystal substrate. That is, the body 102 is a single crystal structure, having the piezoelectric layer 204 (e.g., 128° lithium niobate ($LiNbO_3$) crystal) without the high acoustic velocity layer 206. The dimensions of certain features have been exaggerated for illustration purposes. The transducers 104, 106 are coupled to a surface of the piezoelectric layer 204. In the example shown, the first electrodes 116 are embedded in the piezoelectric layer 204 (that is, positioned on a plane below the surface of the piezoelectric layer 204) and the second electrodes 118 are positioned on the surface of the piezoelectric layer 204.

In this example, an insulating layer 208, such as a layer of dielectric material (e.g., silicon dioxide ($SiO_2$)), is coupled over at least the embedded first electrodes 116, to ensure there is no shorting between the first and second electrodes 116, 118. The thickness of the insulating layer 208 may be about equal to the depth separation between the first and second electrodes 116, 118. In some examples, the insulating layer 208 may cover both sets of electrodes 116, 118. In other examples, the separation (e.g., in the range of about 0.01-0.10λ) between the first and second electrodes 116, 118 along the depth axis z may be sufficient to avoid shorting the electrodes 116, 118, without requiring the insulating layer 208. As described above, in some cases the insulating layer 208 may be included even with sufficient depth separation between the first and second electrodes 116, 118.

The configuration of the SAW device 100 shown in FIG. 4B may be better suited for propagation of waves in Rayleigh mode, whereas the configuration of the SAW device 100 shown in FIG. 2 may be better suited for propagation of waves in Sezawa mode.

Generally, for each of the configurations illustrated in FIG. 2, FIG. 4A and FIG. 4B, the electrodes 116, 118 may be made using any suitable conductive material, for example a metal such as copper (Cu), a conductive material such as graphene, or a combination thereof (e.g., a metal such as Cu with multilayer graphene coupled on top, as described in U.S. patent application Ser. No. 15/713,117, entitled "SURFACE ACOUSTIC WAVE DEVICE", filed Sep. 22, 2017, the entirety of which is hereby incorporated by reference). The electrodes 116, 118 may have a thickness between approximately 0λ and approximately 0.10λ, for example between about 0.01λ and about 0.10λ, for example about 0.06λ (0.024 µm, for an operating frequency of 25 GHz). In the present disclosure, an electrode or a conductive layer may be described as having a thickness of approximately 0λ to indicate that the layer provides electric conduction but no mechanical mass-loading effect (e.g., for simulation purposes); a thickness of approximately 0λ does not indicate that the layer or material is omitted. For example, in various cases a thickness of approximately 0λ may be achieved using a material having a thickness on the order of tens of atoms, such as a multi-layer graphene material. It may be preferable to use a multi-layer graphene rather than a monolayer graphene, in order to achieve a better stress response. Examples of electrodes using multi-layer graphene are described in above-mentioned U.S. patent application Ser. No. 15/713,117, entitled "SURFACE ACOUSTIC WAVE DEVICE", filed Sep. 22, 2017.

As mentioned above, the separation (via the insulating layer 208, if present) between the first and second electrodes 116, 118 along the depth axis z may be measured as the distance between the bottom of the upper electrodes (in the examples of FIGS. 2, 4A and 4B, the second electrodes 118) and the top of the lower electrodes (in the examples of FIGS. 2, 4A and 4B, the first electrodes 116). This depth separation may be referred to as h, more clearly shown in the blowup view in FIG. 4A. In some examples, the upper electrodes may be positive electrodes and the lower electrodes may be negative electrodes. Generally, the polarity of the upper and lower electrodes 116, 118 may be interchanged.

Figure 5A:
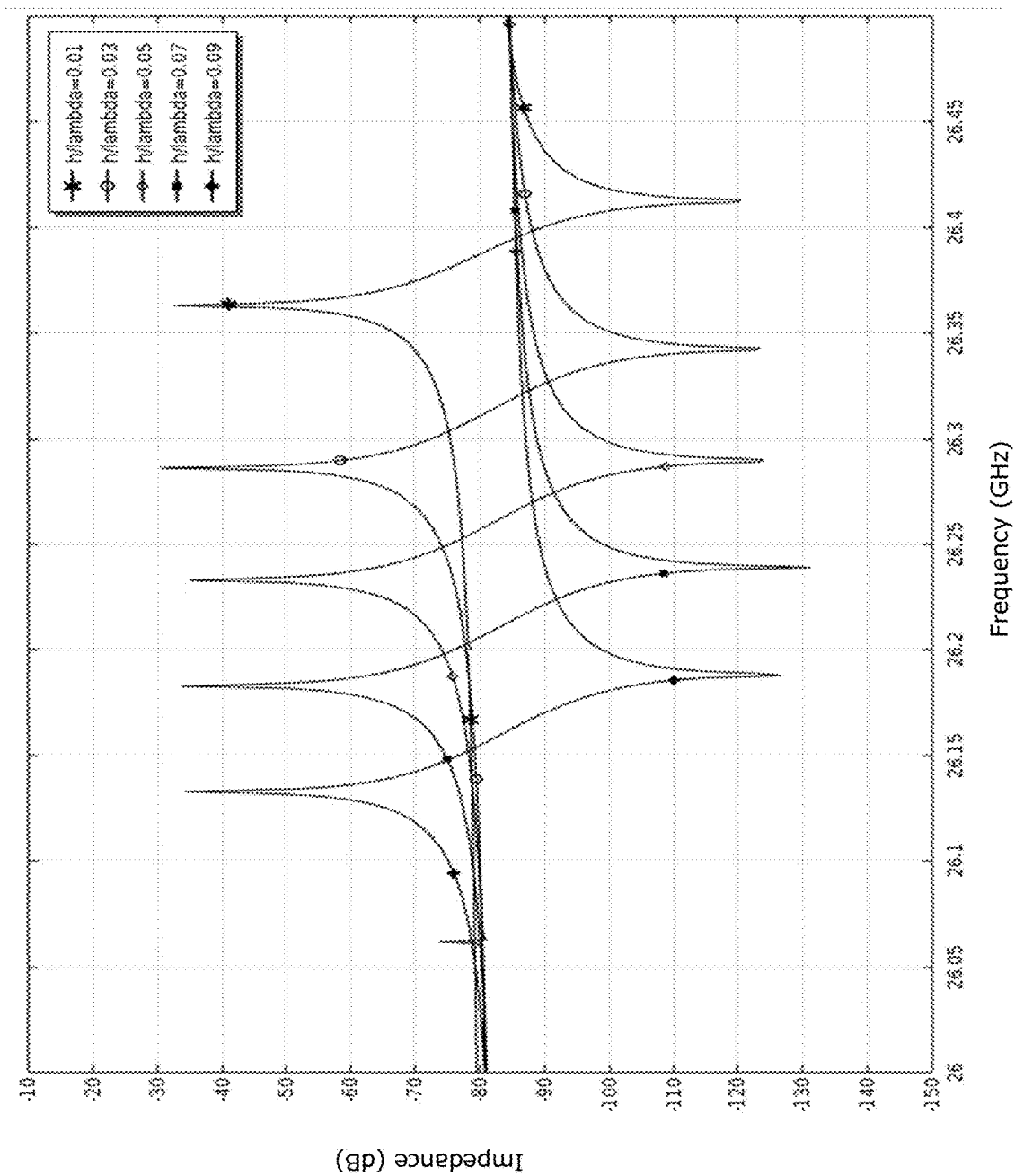
FIG. 5A is a plot of impedance vs. frequency for a transducer in the example disclosed SAW device of FIG. 2, with different depth separation between first and second electrodes.

FIG. 5A is a plot of simulation results illustrating SAW impedance vs. frequency in the example SAW device 100 of FIG. 2, for a depth separation h (via the piezoelectric layer 204) ranging from 0.01λ to 0.09λ (where λ is 0.4 µm, corresponding to the nominal operating frequency of 25 GHz, at Sezawa mode). The simulation results demonstrate that a greater depth separation h between the first and second electrodes 116, 118 results in a frequency shift downwards for the resonance and anti-resonance peaks, and a greater separation between the resonance and anti-resonance peaks. These results illustrate how the depth separation between the first and second electrodes 116, 118 may be designed to achieve a desired performance of the SAW device 100, for example to obtain a wider bandwidth for a SAW filter.

Figure 5B:
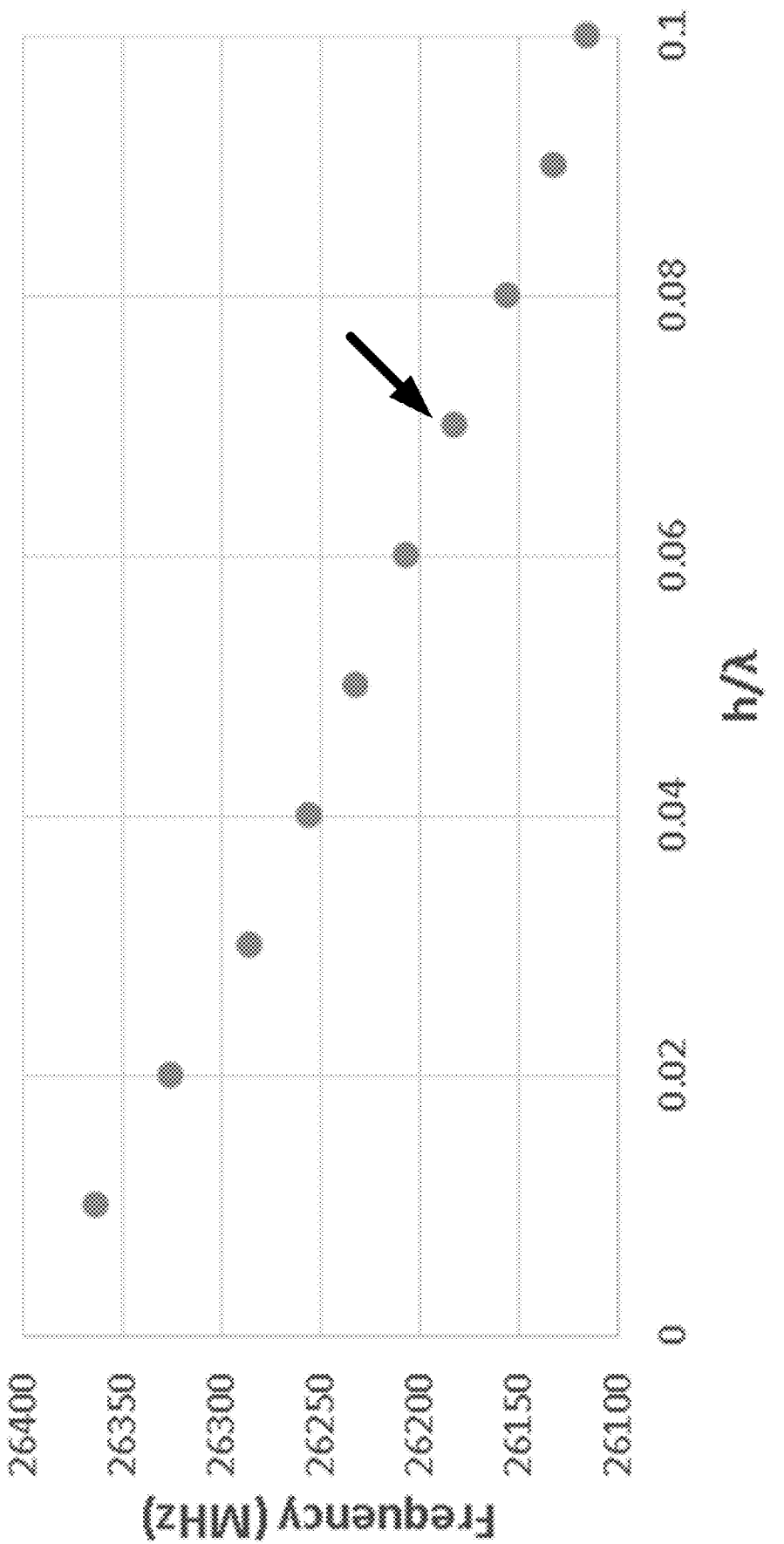
FIGS. 5B to 5D are plots showing the relationship between resonant frequency (FIG. 5B), electromechanical coupling coefficient $k^2$ (FIG. 5C) and von Mises stress in electrodes (FIG. 5D) vs. the depth separation between first and second electrodes for the SAW device of FIG. 2.
Figure 5C:
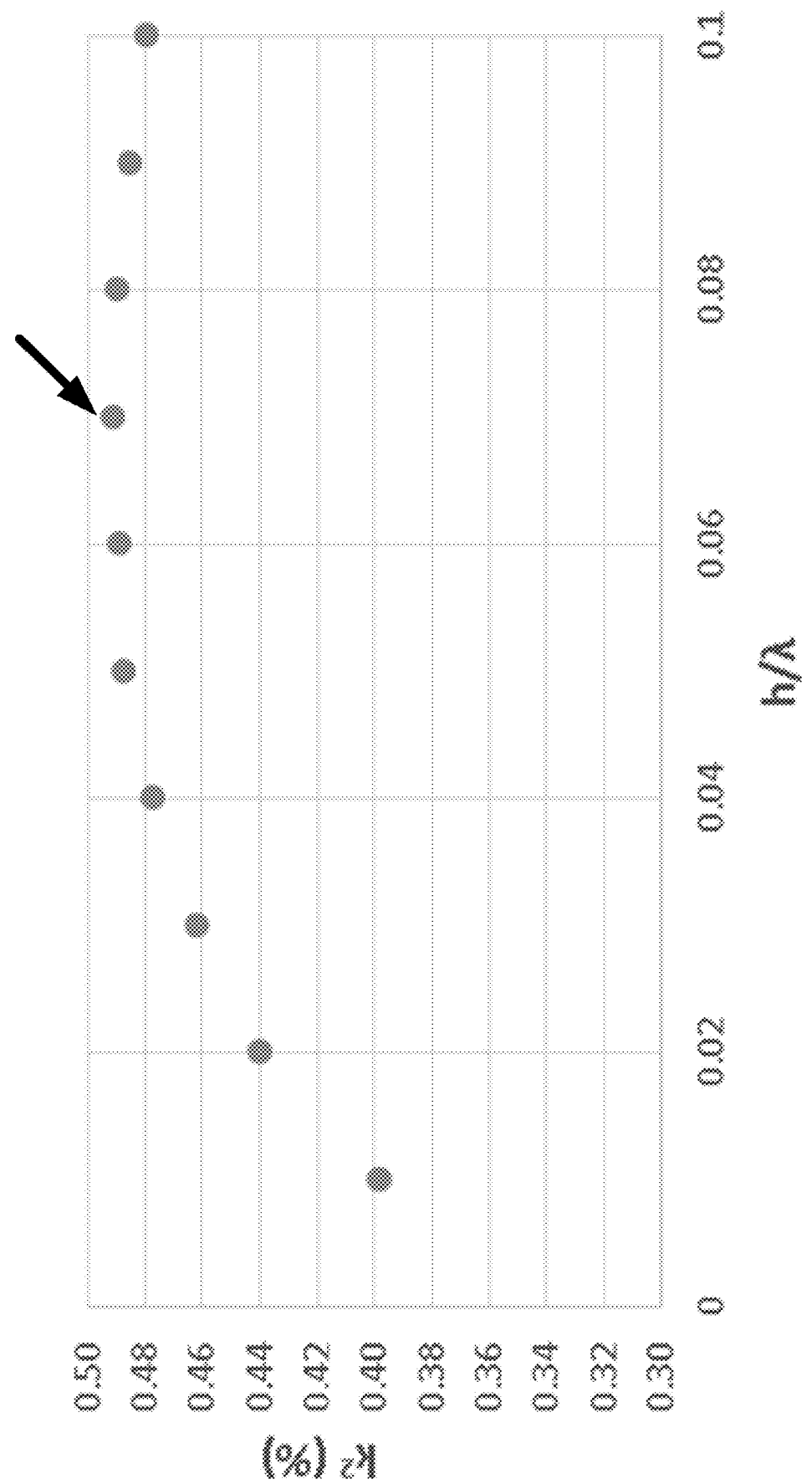
Figure 5D:
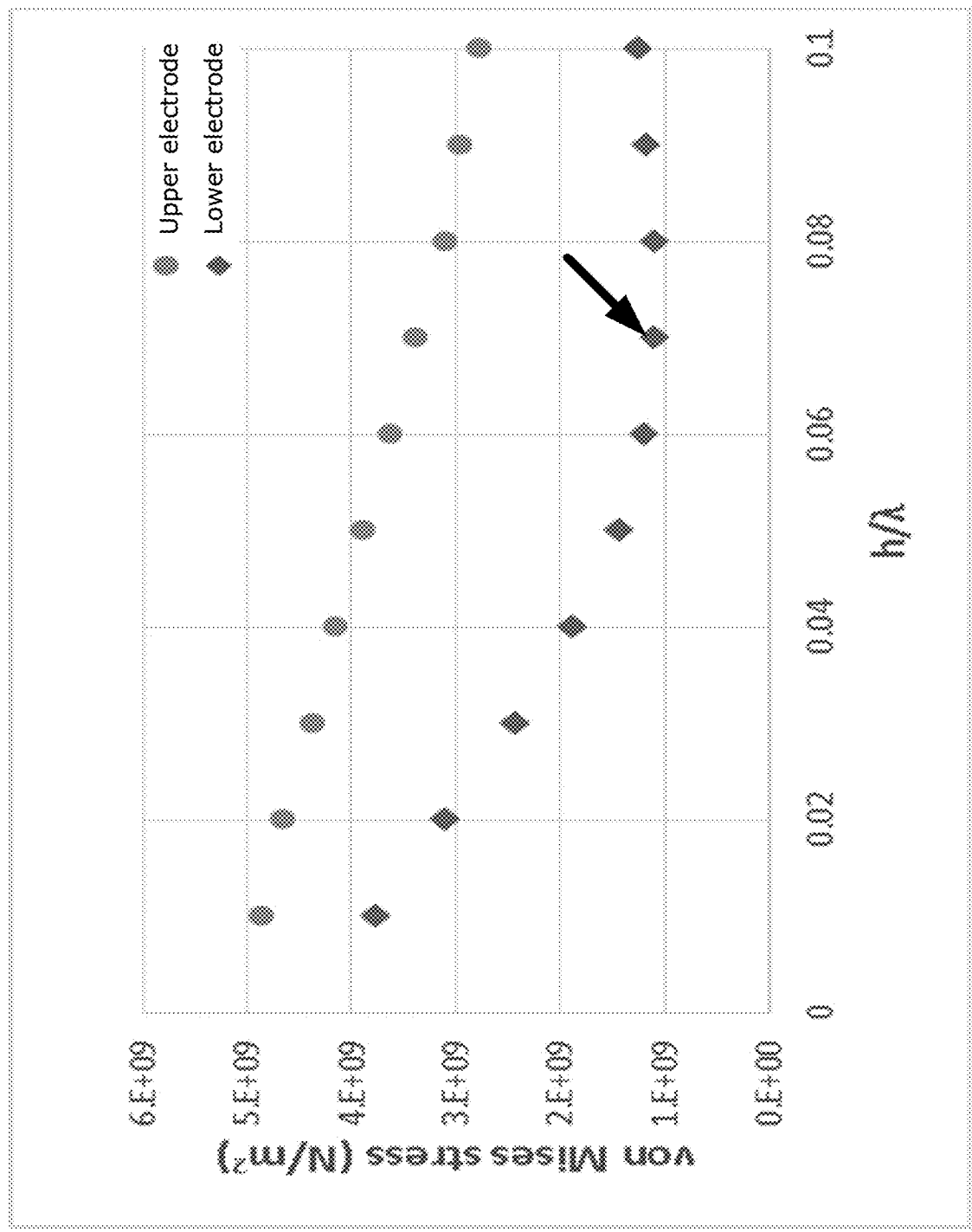

FIGS. 5B to 5D are plots showing the relationship between resonant frequency (FIG. 5B), electromechanical coupling coefficient $k^2$ (FIG. 5C) and von Mises stress in electrodes (FIG. 5D) vs. the depth separation h between the first and second electrodes 116, 118, for the SAW device 100 of FIG. 2. In FIG. 5D, "upper electrode" refers to the electrodes embedded in the piezoelectric layer 204 (i.e., the second electrodes 118 in the example of FIG. 2) and "lower electrode" refers to the electrodes embedded in the high acoustic velocity layer 206 (i.e., the first electrodes 116 in the example of FIG. 2). As indicated by the arrows in FIGS. 5B to 5D, desirable high electromechanical coupling coefficient and low von Mises stress are achieved at a depth separation h of about $0.07\lambda$. At the depth separation of $0.07\lambda$, the resonance peak occurs at about 26.18 GHz, and the anti-resonance peak occurs at about 26.24 GHz (see FIG. 5A).

Figure 6A:
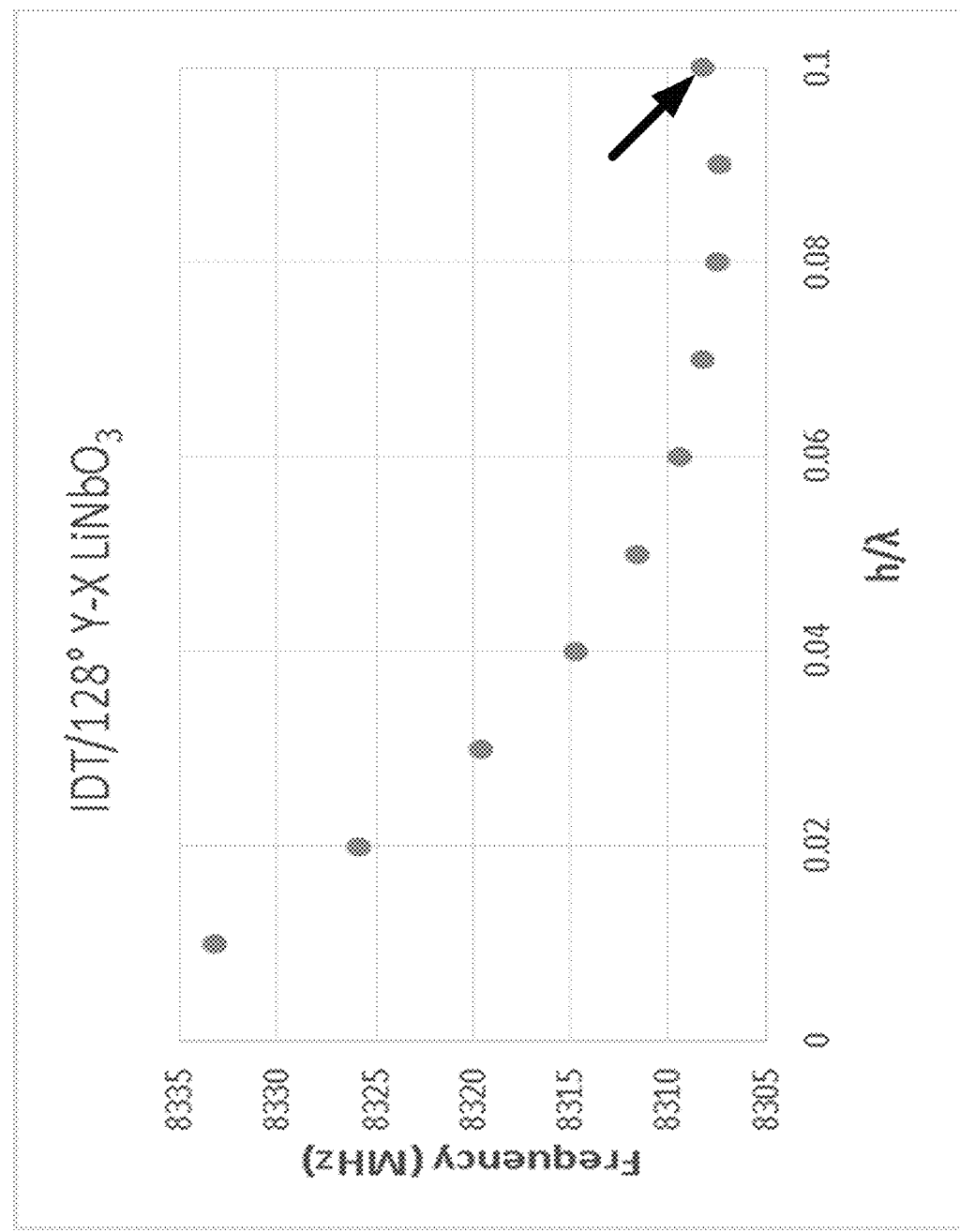
FIGS. 6A to 6C are plots showing the relationship between resonant frequency (FIG. 6A), electromechanical coupling coefficient $k^2$ (FIG. 6B) and von Mises stress in electrodes (FIG. 6C) vs. the depth separation between the first and second electrodes for the SAW device of FIG. 4B.
Figure 6B:
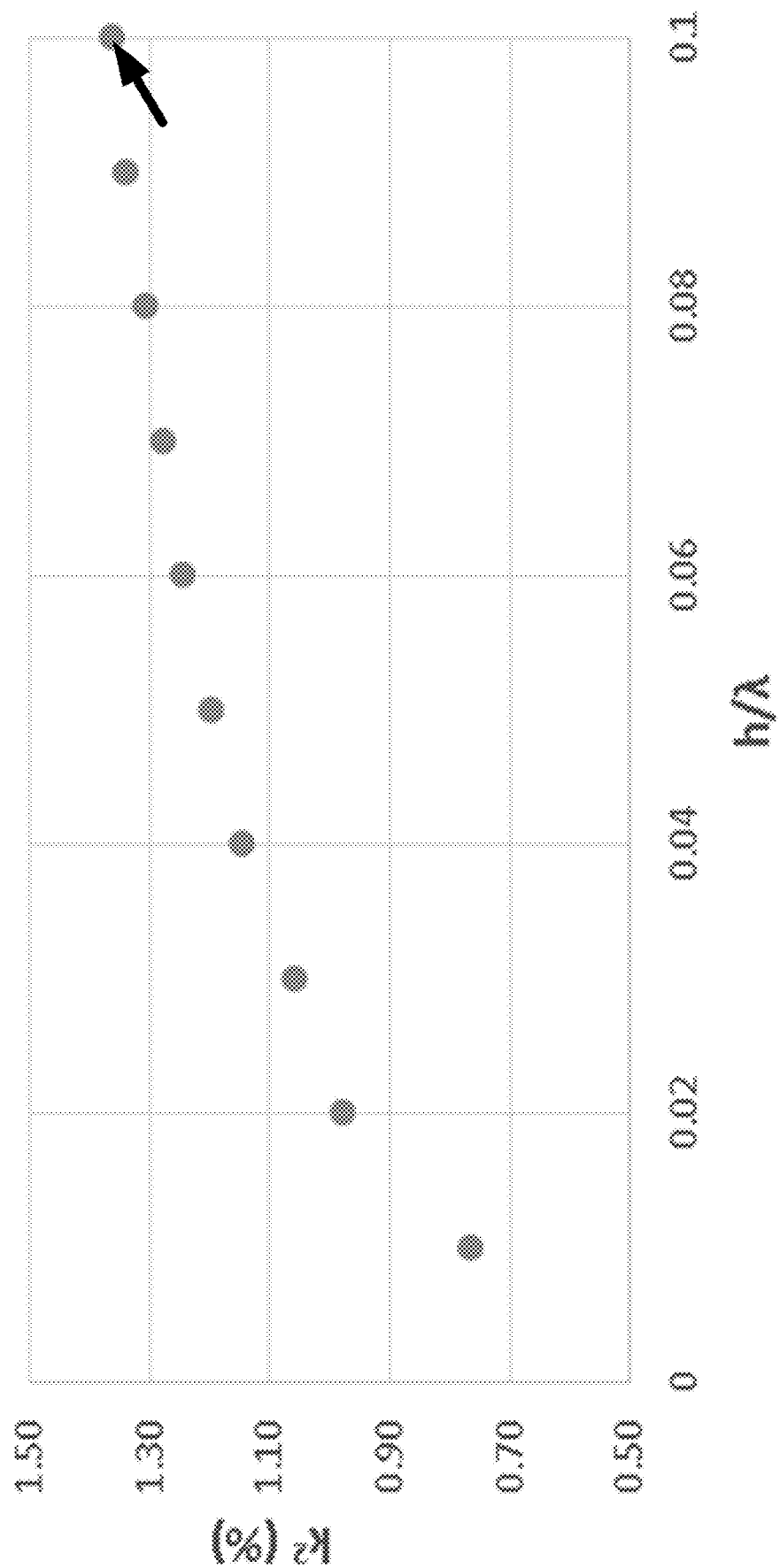
Figure 6C:
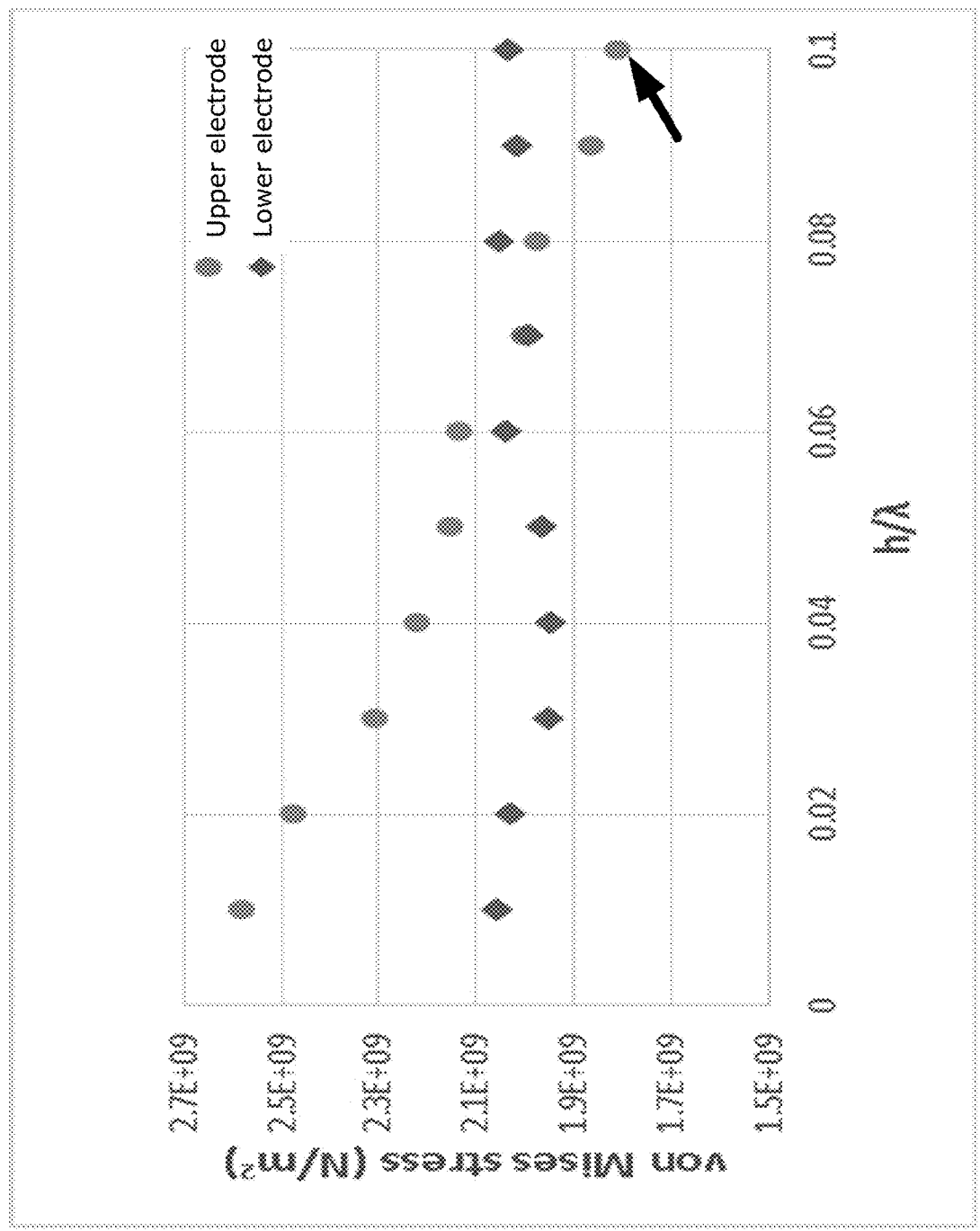
Figure 6D:
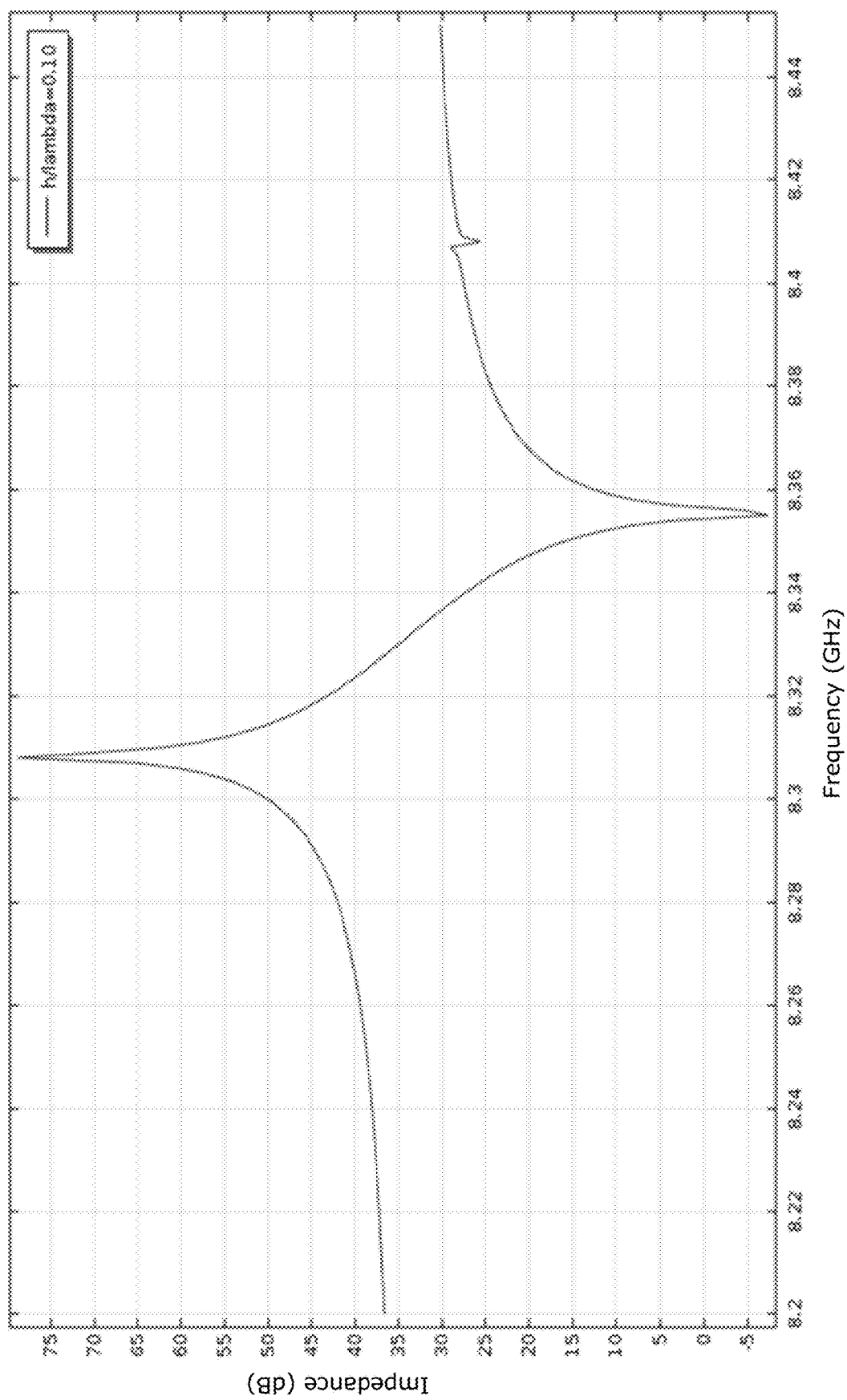
FIG. 6D is a plot of impedance vs. frequency for a transducer in the example disclosed SAW device of FIG. 4B, at a depth separation of 0.1λ between first and second electrodes.

FIGS. 6A to 6C are plots showing the relationship between resonant frequency (FIG. 6A), electromechanical coupling coefficient $k^2$ (FIG. 6B) and von Mises stress in electrodes (FIG. 6C) vs. the depth separation h (via the insulating layer 208, in this example) between the first and second electrodes 116, 118, for the SAW device 100 of FIG. 4B. In FIG. 6C, "upper electrode" refers to the electrodes on the surface of the piezoelectric layer 204 (i.e., the second electrodes 118 in the example of FIG. 4B) and "lower electrode" refers to the electrodes embedded in the piezoelectric layer 204 (i.e., the first electrodes 116 in the example of FIG. 4B). As indicated by the arrows in FIGS. 6A to 6C, desirable high electromechanical coupling coefficient and low von Mises stress are achieved at a depth separation h of about $0.1\lambda$ (where $\lambda$ is 0.4 µm). At the depth separation of $0.1\lambda$, the resonance peak occurs at about 8.31 GHz and the anti-resonance peak occurs at about 8.36 GHz (see FIG. 6D).

In example implementations of the SAW devices 100 of FIGS. 2 and 4A, the thickness of the piezoelectric layer 204 (e.g., AlN layer) may be in the range of about $0.2\lambda$-$0.375\lambda$, and the thickness of the high acoustic velocity layer 206 (e.g., diamond layer) may be any thickness greater than $\lambda$, for example about 10 µm. The conductive layer 202, if used, may have a thickness of about $0\lambda$ to about $0.01\lambda$. The conductive layer 202 may be made of any suitable conductive material, for example any suitable metal or graphene. If graphene is used for the conductive layer 202, it may be preferable to use multi-layer graphene rather than monolayer graphene, in order to achieve better stress response. Examples of conductive layers using multi-layer graphene are described in U.S. patent application Ser. No. 15/713,117, entitled "SURFACE ACOUSTIC WAVE DEVICE", filed Sep. 22, 2017, incorporated by reference above. In example implementations of the SAW device 100 of FIG. 4B, the piezoelectric layer 204 may be generally any thickness greater than $\lambda$, for example about 0.2-0.5 mm.

Figure 7:
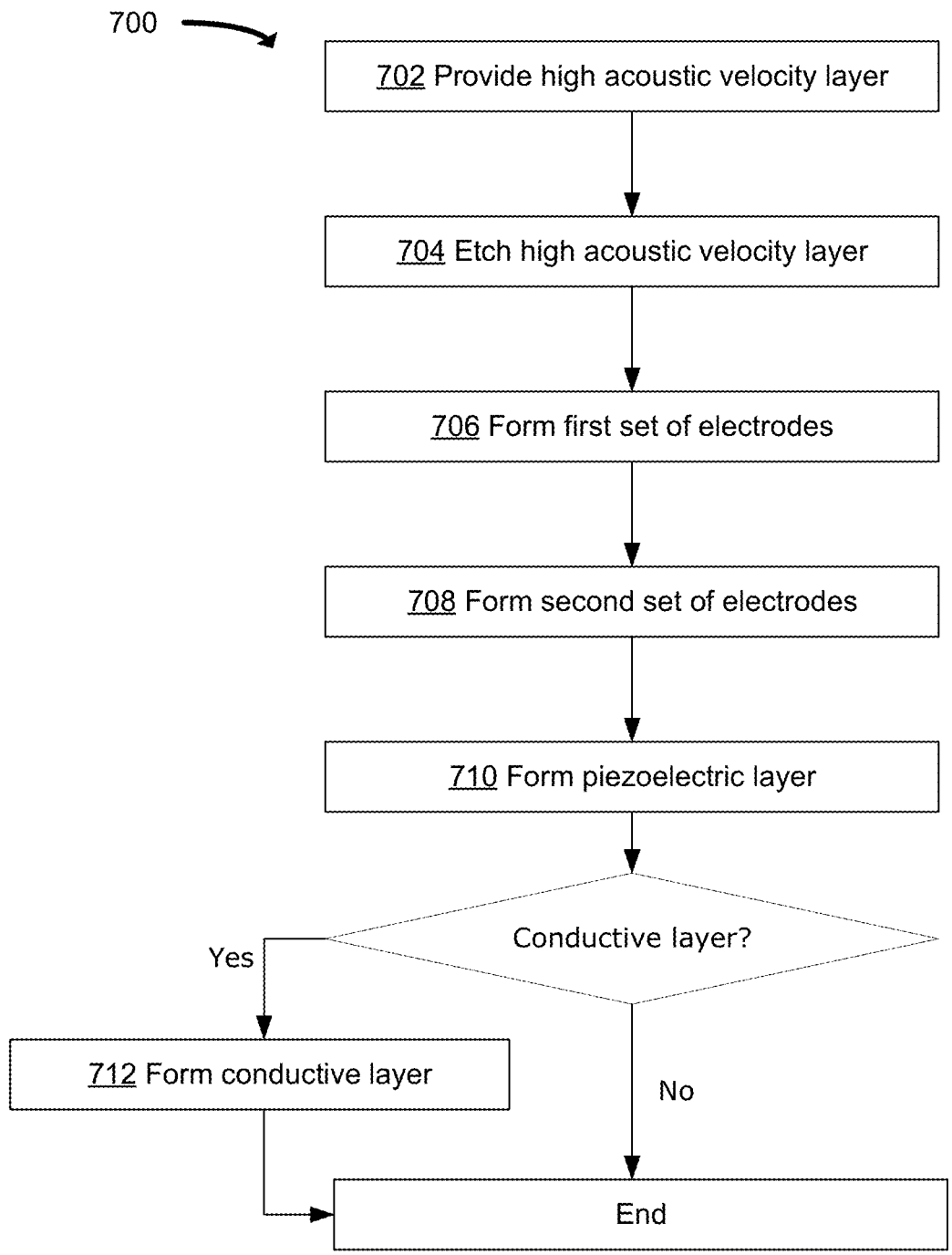
FIGS. 7 and 8 are flowcharts illustrating example methods of fabrication for example SAW devices disclosed herein.
Figure 8:
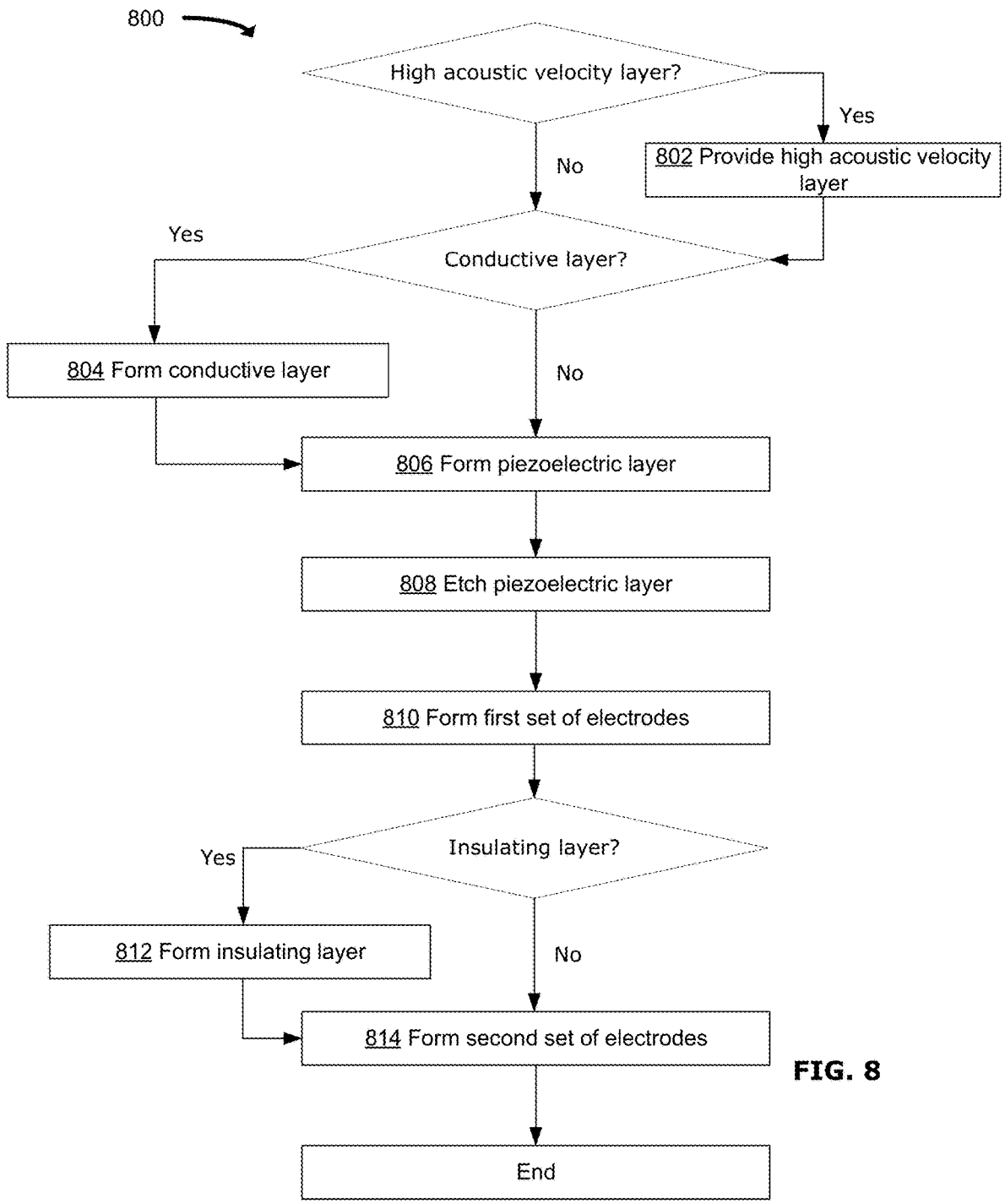

The example SAW devices 100 disclosed herein may be fabricated using any suitable fabrication techniques. Generally, the SAW devices 100 may be fabricated by forming the first set of electrodes at a first depth on a substrate (e.g., in etched portions of the substrate) and forming the second set of electrodes at a second depth on a substrate (e.g., on unetched portions of the substrate). The substrate may be the high acoustic velocity layer (e.g., as in the example shown in FIG. 2) or may be the piezoelectric layer (e.g., as in the examples shown in FIGS. 4A and 4B). The first and second sets of electrodes may be formed using a single mask or using two masks, as discussed further below. FIGS. 7 and 8 are flowcharts illustrating example fabrication methods 700, 800 that may be used. For example, the example method 700 illustrated in FIG. 7 may be used for fabricating the example SAW device 100 of FIG. 2, and the example method 800 illustrated in FIG. 8 may be used for fabricating the example SAW device 100 of FIG. 4A or the example SAW device 100 of FIG. 4B. FIG. 7 is described first.

At 702, the high acoustic velocity layer 206 is provided. For example, a diamond layer may be provided with suitable thickness (typically several times thicker than $\lambda$) using chemical vapor deposition (or other suitable technique) on a support substrate (e.g., a silicon substrate). The diamond layer may also be polished and cleaned.

At 704, the high acoustic velocity layer 206 is etched (e.g., using photolithography) with a mask for patterning a first set of electrodes (i.e., the lower set of electrodes, namely the first electrodes 116 in the examples shown in FIGS. 2 and 4A). The lateral separation (i.e., along the wave propagation axis) of the etching is half of the desired operating wavelength. The depth to which the high acoustic velocity layer 206 is etched will control the depth separation between the first and second electrodes 116, 118. Generally, the high acoustic velocity layer 206 may be etched to a depth equal to the desired depth separation h plus the thickness of one electrode.

At 706, the first set of electrodes is formed on the high acoustic velocity layer 206. The first set of electrodes is formed in the etched portions of the high acoustic velocity layer 206. If the electrodes are made of a metal material (e.g., aluminum (Al)), the electrodes may be formed by depositing a layer of metal using suitable metal deposition techniques, followed by removal of the photoresist. If the electrodes are made of a graphene material, the electrodes may be formed by epitaxial graphene growth to the desired number of atomic layers. After deposition of the metal layer or growth of the graphene multi-layer, sputtering of a thin layer of piezoelectric material (e.g., AlN) and surface polishing may be carried out to achieve a smooth surface.

At 708, the second set of electrodes is formed on the high acoustic velocity layer 206. The second set of electrodes can be formed on the unetched portions of the high acoustic velocity layer 206, using another mask, and using techniques similar to that described for 706 above.

At 710, the piezoelectric layer 204 is formed. For example, this may be by sputtering or chemical vapor deposition of AlN to the desired thickness.

If a conductive layer 202 is required, then at 712 the conductive layer 202 is formed over the piezoelectric layer 204. If the conductive layer 202 is made of graphene, the conductive layer 202 may be formed by growth of a graphene layer to the desired atomic thickness. If the conductive layer 202 is made of metal (e.g., Cu), the conductive layer 202 may be formed by deposition of the metal using any suitable deposition techniques.

Although the formation of the first and second sets of electrodes is described above using two masks, in some examples a single mask may be used. For example, the metal and/or graphene for the first set of electrodes may be formed on the high acoustic velocity layer 206 prior to etching of the high acoustic velocity layer 206. Dry etching is then performed using a photoresist mask, leaving the metal and/or graphene on the unetched portions of the high acoustic velocity layer 206 as the first set of electrodes (in this case, the upper electrodes). Without removing the photoresist mask, metal and/or graphene for the second set of electrodes (in this case, the lower electrodes) is then deposited in the etched portions of the high acoustic velocity layer 206. The photoresist mask (and the extra metal and/or graphene on top) is then removed. The piezoelectric layer 204 and optional conductive layer 202 may then be formed over the electrodes, as described above. This fabrication process using a single mask may help to avoid misalignment of the first and second electrodes, thus avoiding unwanted overlap of the electrodes in the depth direction.

FIG. 8 is now described. Certain steps in the example method 800 may be performed similarly to similar steps in the example method 700.

If there is a high acoustic velocity layer 206, then at 802, the high acoustic velocity layer 206 is provided. For example, a diamond layer may be provided with suitable thickness (typically several times thicker than λ) using chemical vapor deposition (or other suitable technique) on a support substrate (e.g., a silicon substrate). The diamond layer may also be polished and cleaned.

If a conductive layer 202 is required, then at 804 the conductive layer 202 is formed over the high acoustic velocity layer 206. If the conductive layer 202 is made of graphene, the conductive layer 202 may be formed by growth of a graphene layer to the desired atomic thickness. If the conductive layer 202 is made of metal (e.g., Cu), the conductive layer 202 may be formed by deposition of the metal using any suitable deposition techniques.

At 806, the piezoelectric layer 204 is formed. For example, this may be by sputtering or chemical vapor deposition of AlN to the desired thickness, or by growing a LiNbO$_3$ crystal to the desired thickness.

At 808, the piezoelectric layer 204 is etched (e.g., using photolithography) with a mask for patterning a first set of electrodes. The lateral separation (i.e., along the wave propagation axis) of the etching is half of the desired operating wavelength. The depth to which the piezoelectric layer 204 is etched will control the depth separation between the first and second electrodes 116, 118. Generally, the piezoelectric layer 204 may be etched to a depth equal to the desired depth separation h plus the thickness of one electrode.

At 810, the first set of electrodes is formed on the piezoelectric layer 204. The first set of electrodes is formed in the etched portions of the piezoelectric layer 204. If the electrodes are made of a metal material (e.g., aluminum (Al)), the electrodes may be formed by depositing a layer of metal using suitable metal deposition techniques, followed by patterning to remove the metal outside of the etched portions. If the electrodes are made of a graphene material, the electrodes may be formed by epitaxial graphene growth to the desired number of atomic layers, followed by patterning to remove the graphene outside of the etched portions.

If an insulating layer is required, then at 812 the insulating layer may be formed over the piezoelectric layer 204, and the first set of electrodes. For example, a SiO$_2$ layer may be formed as the insulating layer, using any suitable techniques, such as by sputtering. Following sputtering, the photoresist may be removed and surface polishing may be performed.

At 814, the second set of electrodes is formed on the piezoelectric layer 204. The second set of electrodes are formed on the unetched portions of the piezoelectric layer 204, using a second mask, and using techniques similar to that described for 706 above.

Similar to the method 700 described above, the method 800 has been described using two masks; however, in some examples a single mask may be used. For example, the metal and/or graphene for the first set of electrodes may be formed on the piezoelectric layer 204 prior to etching of the piezoelectric layer 204. Dry etching is then performed using a photoresist mask, leaving the metal and/or graphene on the unetched portions of the piezoelectric layer 204 as the first set of electrodes (in this case, the upper electrodes). Without removing the photoresist mask, metal and/or graphene for the second set of electrodes (in this case, the lower electrodes) is then deposited in the etched portions of the piezoelectric layer 204. The photoresist mask (and the extra metal and/or graphene on top) is then removed. This fabrication process using a single mask may help to avoid misalignment of the first and second electrodes, thus avoiding unwanted overlap of the electrodes in the depth direction. When misalignment of the electrodes is avoided, the insulating layer 202 may be omitted without risk of shorting of the electrodes due to misalignment.

The example SAW device 100 of FIG. 4A may be fabricated using the single mask fabrication process and omitting the insulating layer. The example SAW device 100 of FIG. 4B may be fabricated using steps 806 to 814 and including the insulating layer but omitting the high acoustic velocity layer.

In various examples, the electrodes and/or the conductive layer may be formed using any suitable conductive material, such as a metal, a multi-layer graphene, or a metal with multi-layer graphene coupled over top. Suitable metals may include copper (Cu), aluminum (Al), platinum (Pt), and/or Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

In various examples, the piezoelectric layer has been described as being a AlN layer. Other materials may also be used for the piezoelectric layer, such as scandium aluminum nitride (ScAlN), zinc oxide (ZnO), lithium niobate (LiNbO$_3$), lithium tantalite (LiTaO$_3$), quartz and other piezoelectric materials.

In various examples, the high acoustic velocity layer has been described as being a diamond layer. Other materials may also be used for the high acoustic velocity layer, such as silicon carbide (SiC), or other high acoustic velocity materials.

Different configurations of the SAW device have been disclosed herein. A particular configuration may be selected for use depending on the specific application. Although the disclosed SAW device has been described with reference to SAW filters, it should be understood that the disclosed SAW configurations may be adapted for use in other SAW devices.

In various examples disclosed herein, a SAW device is provided that may achieve a high operating frequency (e.g., in the K band frequency range, such as 25 GHz or higher), using conventional fabrication techniques.

The disclosed SAW devices may be useful for implementation as SAW filters in mobile terminals, base station and other infrastructure equipment, for example.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure. For examples, although specific sizes and shapes of electrodes are disclosed herein, other sizes and shapes may be used. In another example, although a particular SAW device (e.g. SAW filter) may be described herein, the structures described may be adapted to other SAW device configurations.

The thicknesses of each of the layers described herein are meant to be illustrative and not restrictive. The figures may exaggerate or minimize the height of these layers for illustrative purposes and/or for ease of reference.

Although the example embodiments may be described with reference to a particular orientation (e.g. top and bottom), this was simply used as a matter of convenience and ease of reference in describing the figures.

Although the present disclosure describes methods and processes with steps in a certain order, one or more steps of the methods and processes may be omitted or altered as appropriate. One or more steps may take place in an order other than that in which they are described, as appropriate.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A surface acoustic wave (SAW) device comprising:
   a piezoelectric layer; and
   at least one transducer coupled to the piezoelectric layer, the at least one transducer including a first set of electrodes and a second set of electrodes, each electrode in the first set of electrodes being directly adjacent to at least one electrode in the second set of electrodes along a wave propagation axis, and the first and second set of electrodes being separated from each other along a depth axis.

2. The SAW device of claim 1, further comprising:
   a high acoustic velocity layer coupled to the piezoelectric layer at a first surface of the piezoelectric layer;
   wherein the at least one transducer is positioned between the piezoelectric layer and the high acoustic velocity layer, and wherein one of the first set or the second set of electrodes is embedded in the piezoelectric layer, and another of the first set or the second set of electrodes is embedded in the high acoustic velocity layer.

3. The SAW device of claim 2, further comprising:
   a conductive layer coupled to a second surface of the piezoelectric layer, opposing the first surface of the piezoelectric layer.

4. The SAW device of claim 3, wherein the conductive layer comprises multi-layer graphene.

5. The SAW device of claim 1, further comprising:
   high acoustic velocity layer coupled to the piezoelectric layer at a first surface of the piezoelectric layer;
   wherein the at least one transducer is coupled to the piezoelectric layer at a second surface of the piezoelectric layer, opposing the first surface of the piezoelectric layer, and wherein one of the first set or the second set of electrodes is embedded in the piezoelectric layer, and another of the first set or the second set of electrodes is on the second surface of the piezoelectric layer.

6. The SAW device of claim 5, further comprising:
   a conductive layer coupled between the piezoelectric layer and the high acoustic velocity layer, wherein the piezoelectric layer and the high acoustic velocity layer are coupled to each other via the conductive layer.

7. The SAW device of claim 6, wherein the conductive layer comprises multi-layer graphene.

8. The SAW device of claim 1, wherein the first set of electrodes is embedded in the piezoelectric layer and the second set of electrodes is on a surface of the piezoelectric layer, the SAW device further comprising:
   an insulating layer covering at least the first set of electrodes.

9. The SAW device of claim 1, wherein the SAW device has an operating wavelength $\lambda$, and wherein the first set and second set of electrodes are separated from each other along the depth axis by a depth separation, the depth separation being in the range of about $0.01\lambda$ to about $0.10\lambda$.

10. The SAW device of claim 9, wherein the depth separation is about $0.07\lambda$.

11. The SAW device of claim 1, wherein the first set and second set of electrodes comprise multi-layer graphene.

12. The SAW device of claim 11, wherein the first set and second set of electrodes comprise multi-layer graphene coupled to metal.

13. The SAW device of claim 1, wherein each electrode in the first set and second set of electrodes has a width of about 0.2 μm.

14. The SAW device of claim 1, wherein the SAW device has an operating frequency in K band frequency range.

15. The SAW device of claim 1, wherein the SAW device has an operating frequency of about 25 GHz.

* * * * *